United States Patent
Kim et al.

(10) Patent No.: US 9,881,944 B2
(45) Date of Patent: Jan. 30, 2018

(54) ARRAY SUBSTRATE AND LIQUID CRYSTAL DISPLAY MODULE INCLUDING TFT HAVING IMPROVED MOBILITY AND METHOD OF FABRICATING THE SAME

(71) Applicant: LG Display Co., LTD., Seoul (KR)

(72) Inventors: Cheol-Se Kim, Daegu (KR); Jae-Hyung Jo, Busan (KR); Duk-Keun Yoo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 110 days.

(21) Appl. No.: 15/180,970

(22) Filed: Jun. 13, 2016

(65) Prior Publication Data

US 2016/0300867 A1 Oct. 13, 2016

Related U.S. Application Data

(60) Division of application No. 14/276,903, filed on May 13, 2014, now Pat. No. 9,391,099, which is a
(Continued)

(30) Foreign Application Priority Data

Feb. 15, 2008 (KR) ......................... 10-2008-0014141

(51) Int. Cl.
*G02F 1/136* (2006.01)
*H01L 27/12* (2006.01)
(Continued)

(52) U.S. Cl.
CPC ........ *H01L 27/1288* (2013.01); *H01L 27/124* (2013.01); *H01L 27/1214* (2013.01);
(Continued)

(58) Field of Classification Search
CPC .......... H01L 27/1288; H01L 29/78669; H01L 29/78696; H01L 27/1214; G02F 1/1368; G02F 2001/136231; G02F 2001/136236
(Continued)

(56) References Cited

U.S. PATENT DOCUMENTS 5,311,040 A 5/1994 Hiramatsu et al.
5,352,907 A * 10/1994 Matsuda ............. H01L 29/4908
257/506
(Continued)

FOREIGN PATENT DOCUMENTS

| KR | 10-2004-0061787 A | 7/2004 |
| KR | 10-2004-0085312 A | 10/2004 |
| KR | 10-2005-0067740 A | 7/2005 |

*Primary Examiner* — Hoan C Nguyen
(74) *Attorney, Agent, or Firm* — Birch, Stewart, Kolasch & Birch, LLP

(57) ABSTRACT

A method of fabricating an array substrate for a liquid crystal display device can include forming a gate line and a gate electrode, and a gate insulating layer; forming an active layer on the gate insulating layer and an ohmic contact layer on the active layer; forming a data line and source and drain electrodes; forming a passivation layer on the source and drain electrodes; and forming a pixel electrode on the passivation layer, in which the ohmic contact layer covers an entire top surface of the active layer between the source and drain electrodes; forming a metallic layer on the gate insulating layer and the ohmic contact layer; etching the metallic layer to faun the data line, and the source drain electrodes, in which a silicide layer is formed on the ohmic contact layer only in the space between the source and drain electrodes; and removing the silicide layer.

16 Claims, 15 Drawing Sheets

Related U.S. Application Data continuation-in-part of application No. 12/196,786, filed on Aug. 22, 2008, now abandoned.

(51) Int. Cl.
*H01L 29/786* (2006.01)
*H01L 29/45* (2006.01)
*G02F 1/1362* (2006.01)

(52) U.S. Cl.
CPC ........ *H01L 27/1255* (2013.01); *H01L 29/458* (2013.01); *H01L 29/78669* (2013.01); *H01L 29/78696* (2013.01); *G02F 2001/136231* (2013.01); *G02F 2001/136236* (2013.01); *G02F 2001/136295* (2013.01); *G02F 2202/103* (2013.01)

(58) Field of Classification Search
USPC ...................................... 349/42–43
See application file for complete search history.

(56) References Cited

U.S. PATENT DOCUMENTS

| | | | |
|---|---|---|---|
| 5,610,737 A | 3/1997 | Akiyama et al. | |
| 5,801,398 A | 9/1998 | Hebiguchi | |
| 5,942,767 A * | 8/1999 | Na | H01L 29/458 |
| | | | 257/382 |
| 6,016,174 A | 1/2000 | Endo et al. | |
| 6,303,946 B1 * | 10/2001 | Sung | H01L 29/41733 |
| | | | 257/59 |
| 6,730,970 B1 | 5/2004 | Katoh et al. | |
| 6,952,195 B2 | 10/2005 | Arakawa | |
| 2002/0018149 A1 | 2/2002 | Kanayama | |
| 2009/0032819 A1 | 2/2009 | Lim et al. | |
| 2009/0189160 A1 * | 7/2009 | Ahn | H01L 21/02532 |
| | | | 257/66 |
| 2009/0325341 A1 | 12/2009 | Itagaki et al. | |

* cited by examiner

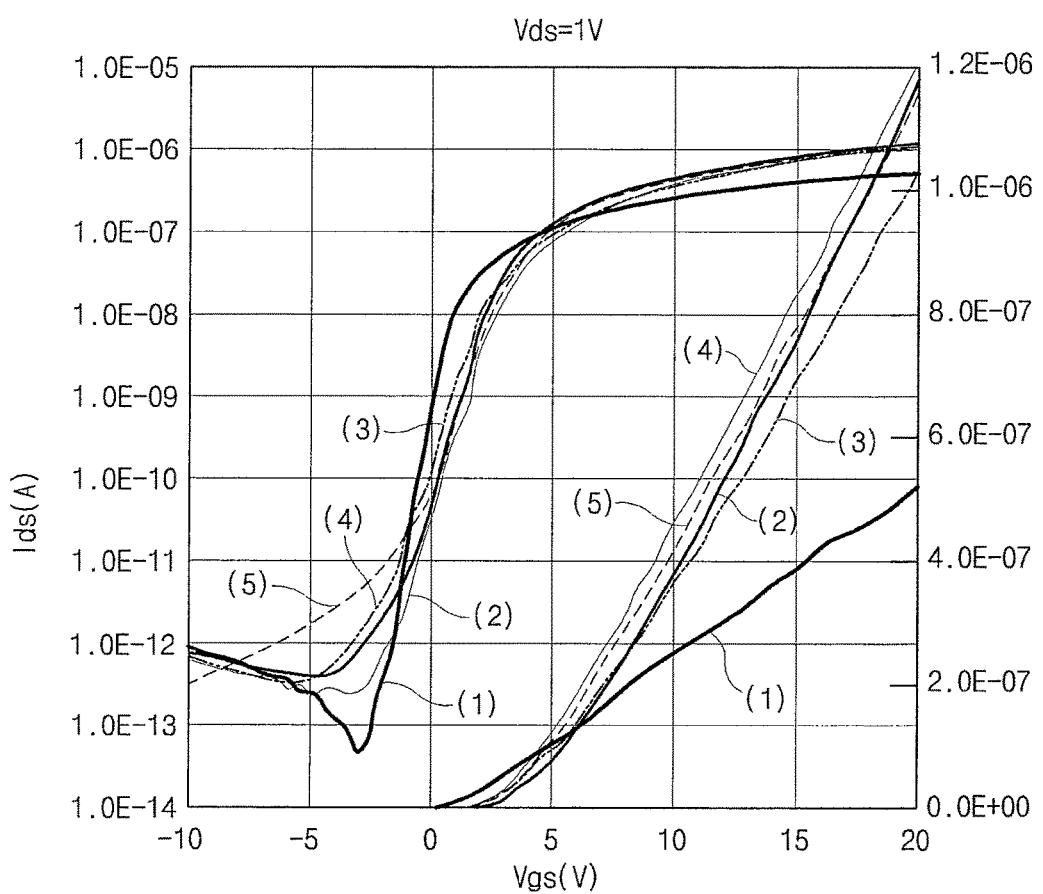

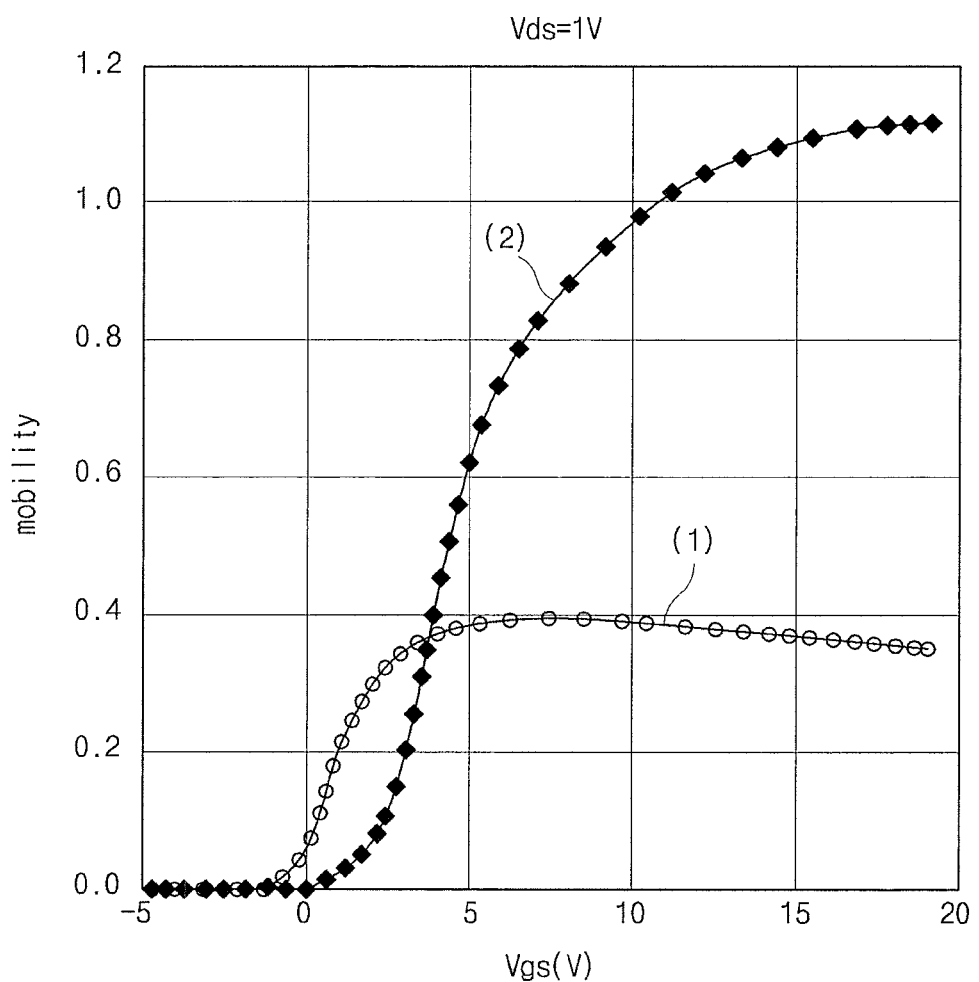

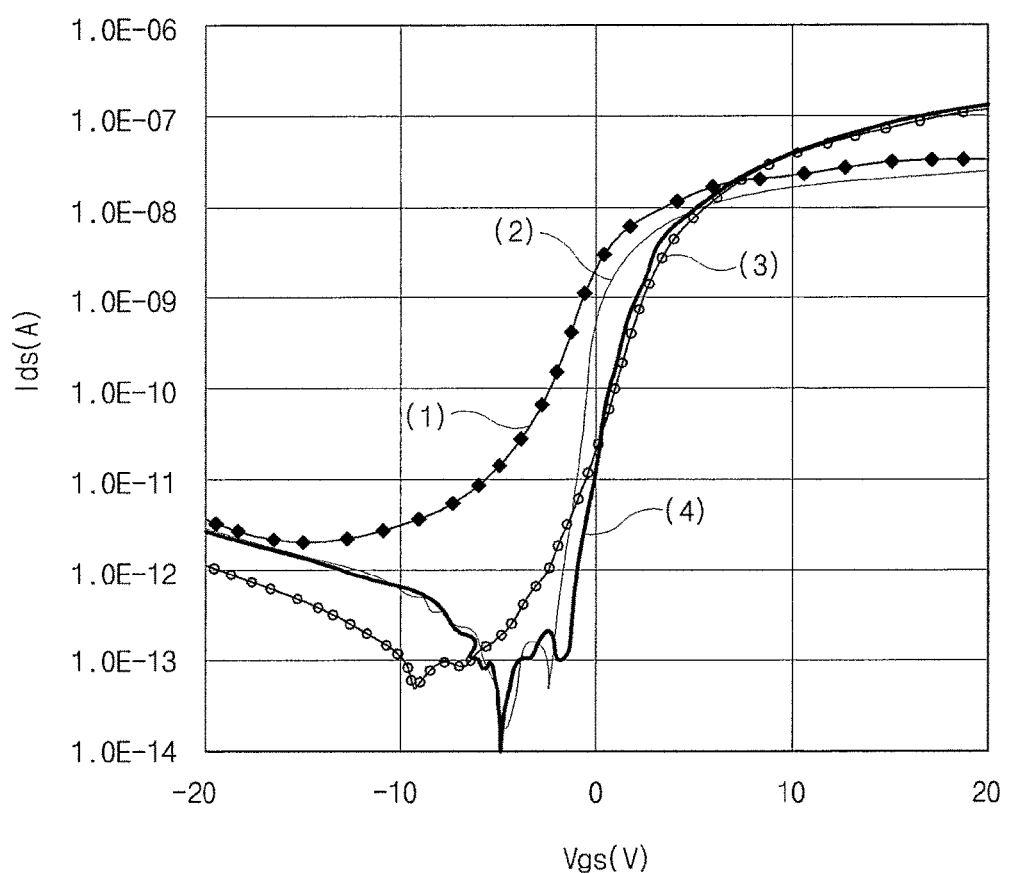

US 9,881,944 B2

ARRAY SUBSTRATE AND LIQUID CRYSTAL DISPLAY MODULE INCLUDING TFT HAVING IMPROVED MOBILITY AND METHOD OF FABRICATING THE SAME

CROSS-REFERENCE TO RELATED APPLICATIONS

This application is a Divisional of co-pending U.S. application Ser. No. 14/276,903, filed on May 13, 2014, which is a Continuation-in-Part of U.S. application Ser. No. 12/196,786, filed on Aug. 22, 2008, which claims the priority benefit of Korean Patent Application No. 10-2008-0014141, filed on Feb. 15, 2008. The entire contents of all these applications are hereby incorporated by reference.

BACKGROUND OF THE INVENTION

Field of the Disclosure

The present invention relates to an array substrate for a liquid crystal display (LCD) device and more particularly to an array substrate for an LCD device having improved properties and being capable of preventing a photo leakage current problem, and a method of fabrication the array substrate.

Description of the Related Art

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules. In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics of high resolution and displaying moving images, the AM-LCD device has been widely used.

FIG. 1 is a plan view of a pixel region of the related art array substrate for the LCD device. In FIG. 1, a gate line 20 and a data line 30 are formed on a substrate 10. The gate and data lines 20 and 30 cross each other to define a pixel region "P". A thin film transistor (TFT) "T" is formed at a crossing portion of the gate and data lines 20 and 30. The TFT "T" includes a gate electrode 25, a semiconductor layer (not shown), a source electrode 32 and a drain electrode 34. The gate electrode 25 extends from the gate line 20, and the semiconductor layer is formed over the gate electrode 25 to overlap the gate electrode 25. The source electrode 32 extends from the data line 30 and is spaced apart from the drain electrode 34. The source and drain electrodes 32 and 34 contact the semiconductor layer. Although not shown, the semiconductor layer includes an active layer of intrinsic amorphous silicon and an ohmic contact layer of impurity-doped amorphous silicon. In addition, a pixel electrode 70 contacting the drain electrode 34 through a drain contact hole "CH1", which exposes a portion of the drain electrode 34, is formed in the pixel region "P".

Referring to FIGS. 2A to 2G, a method of fabricating the related art array substrate is explained. FIGS. 2A to 2G are cross-sectional views showing a fabricating process of a portion taken along the line II-II' in FIG. 1. A region, where the TFT is formed, is defined as a switching region "S(T)".

FIG. 2A shows a first mask process. In FIG. 2A, a first metal layer (not shown) is formed on the substrate 10 by depositing a conductive metallic material. The conductive metallic material includes copper (Cu), molybdenum (Mo), aluminum (Al), aluminum alloy (AlNd) and chrome (Cr). The first metal layer is patterned using a first mask (not shown) to form the gate line 20 (of FIG. 1) and the gate electrode 25. The gate electrode 25 extends from the gate line 20 (of FIG. 1) and is disposed in the switching region "S(T)". Next, a gate insulating layer 45 is formed on the substrate 10, where the gate line 20 (of FIG. 1) and the gate electrode 25 are formed, by depositing an inorganic insulating material. The inorganic insulating material includes silicon oxide ($SiO_2$) and silicon nitride (SiNx).

FIGS. 2B and 2C show a second mask process. In FIG. 2B, an intrinsic amorphous silicon layer 40a of intrinsic amorphous silicon and an impurity-doped amorphous silicon layer 41a of impurity-doped amorphous silicon are sequentially formed on the gate insulating layer 45. The intrinsic amorphous silicon layer 40a and the impurity-doped amorphous silicon layer 41a have first and second thickness, respectively. For example, the first thickness of the intrinsic amorphous silicon layer 40a may be about 1500 angstroms to about 2000 angstroms, and the second thickness of the impurity-doped amorphous silicon layer 41a may be about 500 angstroms to about 1000 angstroms. Namely, the intrinsic amorphous silicon layer 40a has a greater thickness than the impurity-doped amorphous silicon layer 41a. For example, a thickness of the intrinsic amorphous silicon layer 40a may be nearly five times as much as that of the impurity-doped amorphous silicon layer 41a.

In FIG. 2C, the intrinsic amorphous silicon layer 40a (of FIG. 2B) and the intrinsic amorphous silicon layer 40a (of FIG. 2B) are patterned using a second mask (not shown) to form an active layer 40 and an ohmic contact layer 41. The active layer 40 overlaps the gate electrode 25, and the ohmic contact layer 41 is disposed on the active layer 40. The active layer 40 and the ohmic contact layer 41 have the same plane area as each other. The active layer 40 and the ohmic contact layer 41 constitute a semiconductor layer 42.

FIGS. 2D and 2E show a third mask process. In FIG. 2D, a second metal layer (not shown) is formed on the semiconductor layer 42 by depositing a conductive metallic material. The conductive metallic material includes copper (Cu), molybdenum (Mo), aluminum (Al), aluminum alloy (AlNd) and chrome (Cr). The second metal layer is patterned using a third mask (not shown) to form the data line 30, the source electrode 32 and the drain electrode 34. The data line 30 crosses the gate line 20 (of FIG. 1) to define the pixel region "P". The source electrode 32 extends from the data line 30 and is spaced apart from the drain electrode 34. As a result, a portion of the ohmic contact layer 41 is exposed between the source and drain electrodes 32 and 34.

Next, in FIG. 2E, the exposed portion of the ohmic contact layer 41 is etched by a dry-etching process using the source and drain electrodes 32 and 34 as an etching mask to expose a portion of the active layer 40. The portion of the active layer 40 is over-etched to form a back-etch type channel "ch". The gate electrode 25, the gate insulating layer 45, the semiconductor layer 42, which includes the active layer 40 and the ohmic contact layer 41, the source electrode 32 and the drain electrode 34 constitute the TFT "T" (of FIG. 1) in the switching region "S(T)".

FIG. 2F shows a fourth mask process. In FIG. 2F, a passivation layer 55 is formed on the data line 30, the source electrode 32 and the drain electrode 34. The passivation layer 55 includes one of an inorganic insulating material, such as silicon nitride and silicon oxide, and an organic insulating material, such as acryl-based resin and benzocyclobutene (BCB). The passivation layer 55 is patterned using a fourth mask (not shown) to form a drain contact hole "CH1" exposing a portion of the drain electrode 34.

FIG. 2G shows a fifth mask process. In FIG. 2G, a transparent conductive metal layer (not shown) is formed on the passivation layer 55 including the drain contact hole "CH1". The transparent conductive metal layer includes a transparent conductive material, for example, indium-tin-oxide (ITO) or indium-zinc-oxide (IZO). The transparent conductive metal layer is patterned using a fifth mask (not shown) to form the pixel electrode 70 in the pixel region "P". The pixel electrode 70 contacts the drain electrode 34 through the drain contact hole "CH1".

The related art array substrate for the LCD device is fabricated by the above-mentioned five mask process. In the related art array substrate, the active layer 40 has a greater thickness than the ohmic contact layer 41 to obtain the back-etch type channel "ch". As mentioned above, a thickness of the intrinsic amorphous silicon layer 40a may be nearly five times as much as that of the impurity-doped amorphous silicon layer 41a. When there is a process error in etching the exposed ohmic contact layer 41 and the active layer 40 to form the back-etch type channel "ch", not only the active layer 40 but also the gate insulating layer 45 may have an damage such that properties of the TFT are degraded. To prevent these problems, the active layer 40 has a greater thickness than the ohmic contact layer 41.

However, the active layer 40 having the relatively high thickness causes resistance between the source electrode 32 and the channel "ch" or/and between drain electrode 34 and the channel "ch" to be increased. As a result, properties of the TFT "T" are degraded. Particularly, the greater thickness the active layer 40 has, the much photo leakage current there is. The photo leakage current is generated when the active layer 40 is exposed to the light from a backlight unit or the ambient light. The photo leakage current causes the properties of the TFT "T" to be degraded. Moreover, the photo leakage current causes a cross-talk problem such that a displaying image quality in the LCD device is also degraded. Furthermore, the great thickness of the active layer 40 requires the production time and the initial investment for the machine to be increased. Namely, productivity is decreased.

SUMMARY OF THE INVENTION

Accordingly, the present invention is directed to an array substrate for an LCD device and a method of fabrication the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a liquid crystal display device includes a gate line and a gate electrode on a substrate, the gate electrode connected to the gate line; a gate insulating layer on the gate line and the gate electrode; an active layer of intrinsic amorphous silicon on the gate insulating layer and corresponding to the gate electrode; an ohmic contact layer of impurity-doped amorphous silicon on the active layer; a data line crossing the gate line; a source electrode on the ohmic contact layer and connected to the data line; a drain electrode on the ohmic contact layer and spaced apart from the source electrode; a passivation layer on the source and drain electrodes and including a drain contact hole exposing a portion of the drain electrode; and a pixel electrode on the passivation layer and connected to the drain electrode through the drain contact hole, wherein the ohmic contact layer covers the active layer in a space between the source and drain electrodes.

In another aspect of the present invention, a method of fabricating an array substrate for a liquid crystal display device includes forming a gate line and a gate electrode on a substrate, the gate electrode connected to the gate line; forming a gate insulating layer on the gate line and the gate electrode; forming an active layer of intrinsic amorphous silicon on the gate insulating layer and an ohmic contact layer of impurity-doped amorphous silicon on the active layer, the active layer corresponding to the gate electrode; forming a data line, a source electrode and a drain electrode, the data line crossing the gate line, the source electrode on the ohmic contact layer and connected to the data line, and the drain electrode on the ohmic contact layer and spaced apart from the source electrode; forming a passivation layer on the source and drain electrodes and including a drain contact hole exposing a portion of the drain electrode; and forming a pixel electrode on the passivation layer and connected to the drain electrode through the drain contact hole, wherein the ohmic contact layer covers the active layer in a space between the source and drain electrodes.

In another aspect of the present invention, a liquid crystal display module includes a liquid crystal panel including an array substrate and a color filter substrate, the array substrate including: a gate line and a gate electrode on a substrate, the gate electrode connected to the gate line; a gate insulating layer on the gate line and the gate electrode; an active layer of intrinsic amorphous silicon on the gate insulating layer and corresponding to the gate electrode; an ohmic contact layer of impurity-doped amorphous silicon on the active layer; a data line crossing the gate line; a source electrode on the ohmic contact layer and connected to the data line; a drain electrode on the ohmic contact layer and spaced apart from the source electrode; a passivation layer on the source and drain electrodes and including a drain contact hole exposing a portion of the drain electrode; and a pixel electrode on the passivation layer and connected to the drain electrode through the drain contact hole, wherein the ohmic contact layer covers the active layer in a space between the source and drain electrodes; and a backlight unit for projecting light on the liquid crystal panel and disposed under the array substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 7 is a graph showing an I-V transfer curve in a TFT of an array substrate according to an embodiment of the present invention;

FIG. 8 is a graph showing mobility of an electric charge depending on a gate voltage in a TFT of an array substrate according to an embodiment of the present invention;

FIG. 9 is a graph showing a drain-source current depending on a gate-source voltage in a TFT of an array substrate according to an embodiment of the present invention.

DETAILED DESCRIPTION OF THE PREFERRED EMBODIMENTS

Reference will now be made in detail to the preferred embodiments, examples of which are illustrated in the accompanying drawings.

In an array substrate for an LCD device according to a first embodiment of the present invention, an ohmic contact layer and an active layer is not etched such that it is possible to form the active layer having a less thickness than the active layer in the related art array substrate. A flow of a free electron in a channel is efficiently controlled by an voltage of negative or positive applied to a gate electrode such that a driving property of the TFT is improved.

Figure 1:
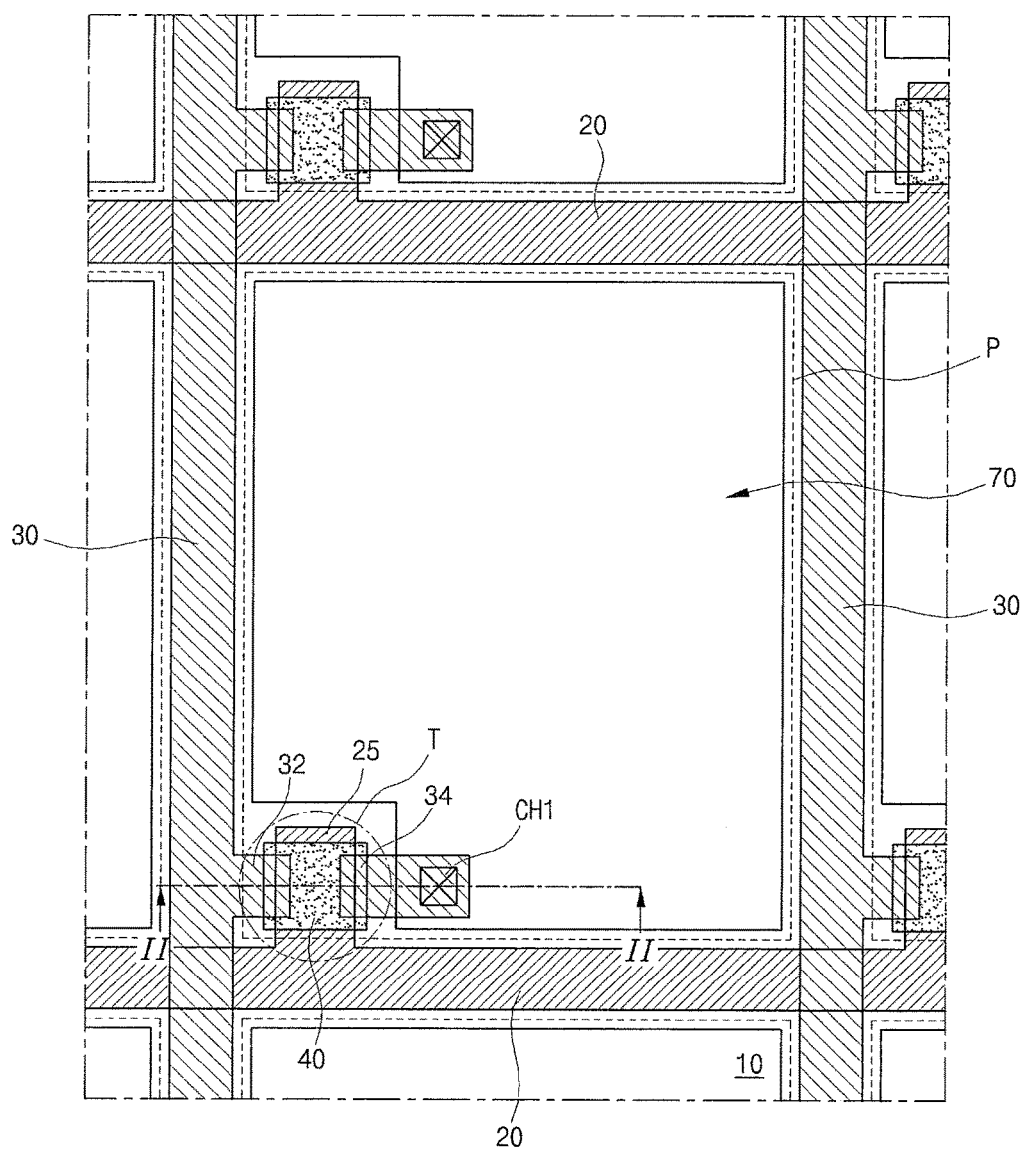
FIG. 1 is a plan view of a pixel region of the related art array substrate for the LCD device.
Figure 2A:
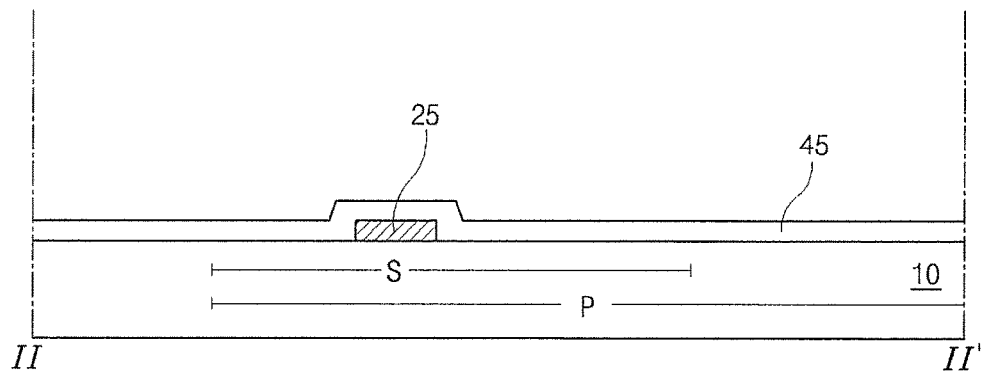
FIGS. 2A to 2G are cross-sectional views showing a fabricating process of a portion taken along the line in FIG. 1.
Figure 2B:
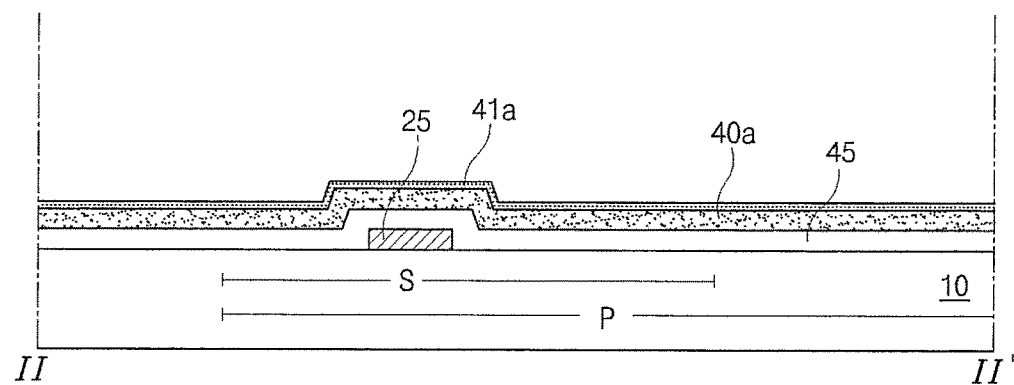
Figure 2C:
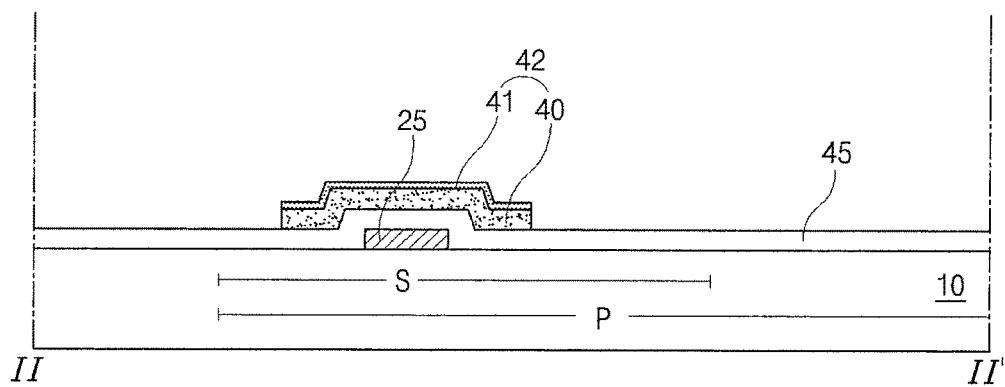
Figure 2D:
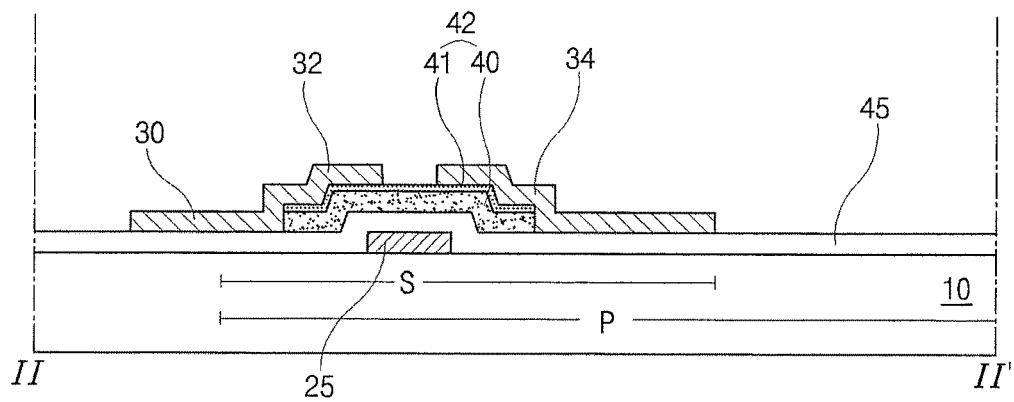
Figure 2E:
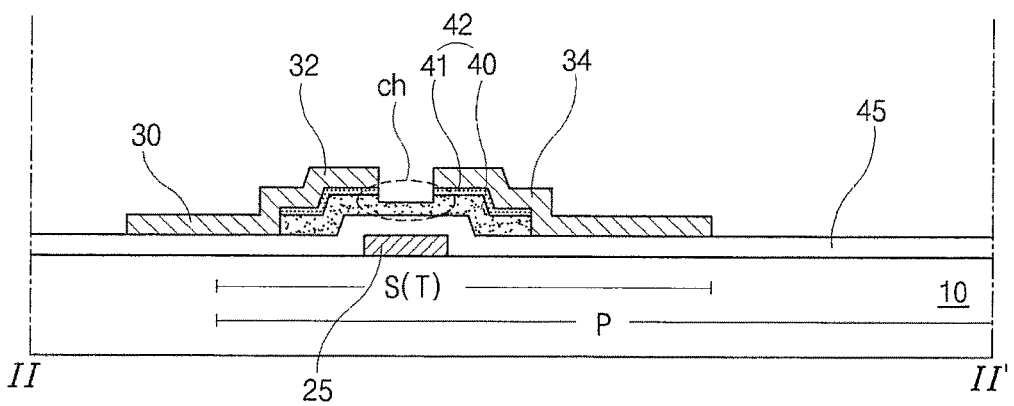
Figure 2F:
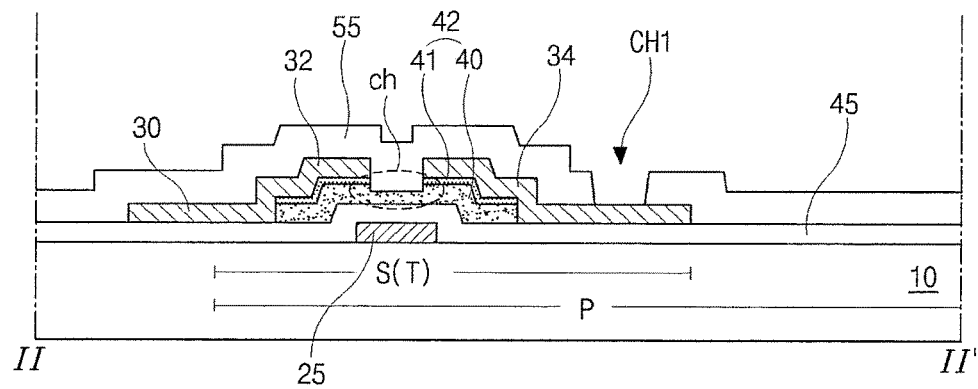
Figure 2G:
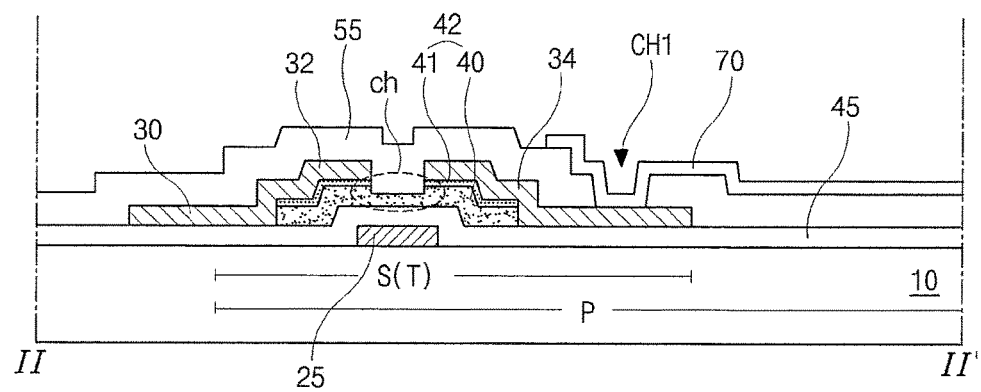
Figure 3:
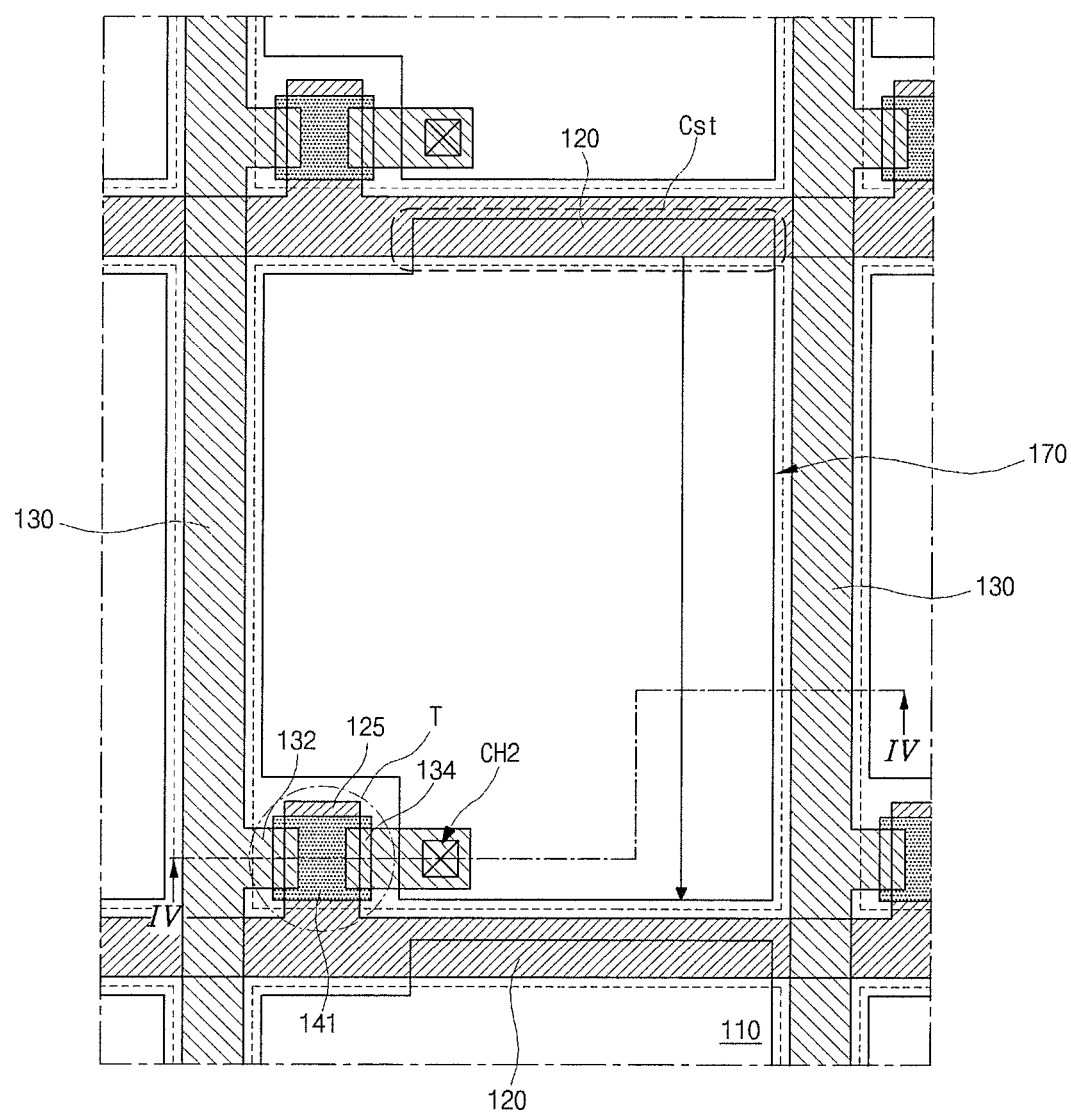
FIG. 3 is a plan view of a pixel region of an array substrate for an LCD device according to a first embodiment of the present invention.
Figure 4:
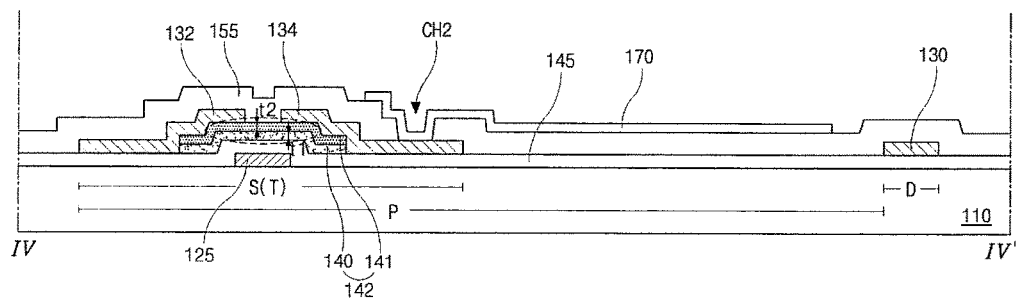
FIG. 4 is a cross-sectional view of a portion taken along the line IV-IV' in FIG. 3.

FIG. 3 is a plan view of a pixel region of an array substrate for an LCD device according to a first embodiment of the present invention, and FIG. 4 is a cross-sectional view of a portion taken along the line IV-IV' in FIG. 3.

In FIGS. 3 and 4, a gate line 120 is formed on a substrate 110, and a data line 130 crosses the gate line 120 to define a pixel region "P". The data line 130 may be perpendicular or inclined to the gate line 120. A thin film transistor (TFT) "T" as a switching element is formed at a crossing portion of the gate and data lines 120 and 130. The TFT "T" includes a gate electrode 125, a gate insulating layer 145, a semiconductor layer 142 including an active layer 140 and an ohmic contact layer 141, a source electrode 132 and a drain electrode 134. The gate electrode 125 extends from the gate line 120, and the gate insulating layer 145 is formed on the gate line 120 and the gate electrode 125. The semiconductor layer 142 is formed on the gate insulating layer 145 and overlaps the gate electrode 125. The ohmic contact layer 141 is disposed on the active layer 140 and has the same plane area as the active layer 140. The source electrode 132 extends from the data line 130 and is spaced apart from the drain electrode 134. The source and drain electrodes 132 and 134 contact the ohmic contact layer 141. The TFT "T" is connected to the gate line 120 and the data line 130 through the gate electrode 125 and the source electrode 132, respectively.

The active layer 140 of intrinsic amorphous silicon has a first thickness "t1", and the ohmic contact layer 141 of impurity-doped amorphous silicon has a second thickness "t2". For example, the first thickness "t1" of the active layer 140 may be about 100 angstroms to about 700 angstroms, and the second thickness "t2" of the ohmic contact layer 141 may be about 50 angstroms to about 500 angstroms. The active layer 140 may have substantially the same thickness as the ohmic contact layer 141. A portion of the ohmic contact layer 141 is exposed between the source and drain electrodes 132 and 134.

In addition, a passivation layer 155 including a drain contact hole "CH2" is formed on the TFT "T". The drain contact hole "CH2" exposes a portion of the drain electrode 134. A pixel electrode 170, which is formed on the passivation layer 155 and in the pixel region "P", contacts the drain electrode 134 through the drain contact hole "CH2". The pixel electrode 170 extends to a previous gate line 120 to overlap a portion of the gate line 120. The overlapped portion of the gate line 120 functions as a first electrode, the overlapped portion of the pixel electrode 170 functions as a second electrode, and the gate insulating layer 145 and the passivation layer 155 function as a dielectric material layer. The first electrode, the second electrode and the dielectric material layer constitute a storage capacitor "Cst". On the other hand, although not shown, a metal pattern (not shown), which is disposed on the gate insulating layer 145, may be disposed between the first and second electrodes. The metal pattern is connected to one of the first and second electrodes. In this case, only one of the gate insulating layer and the passivation layer functions as the dielectric material layer.

In the array substrate of the first embodiment, the active layer 140 may have substantially the same thickness as the ohmic contact layer 141. As a result, a production time or the initial investment for the machine can be reduced. In addition, since the ohmic contact layer 141 is not separated, there is an advantage in an electric charge mobility through the channel.

On the other hand, although not shown, the TFT "T" in FIGS. 3 and 4 can be available for an in-plane switching (IPS) mode LCD device where a pixel electrode and a common electrode are alternately arranged in a single substrate.

Referring to FIGS. 5A to 5I, a method of fabricating an array substrate for an LCD device according to the first embodiment of the present invention is explained. FIGS. 5A to 5I are cross-sectional views showing a fabricating process of a portion taken along the line IV-IV' in FIG. 3. A switching region "S(T)", where a TFT is formed, a pixel region "P" and a data region "D", where a data line is formed, are defined on a substrate.

Figure 5A:
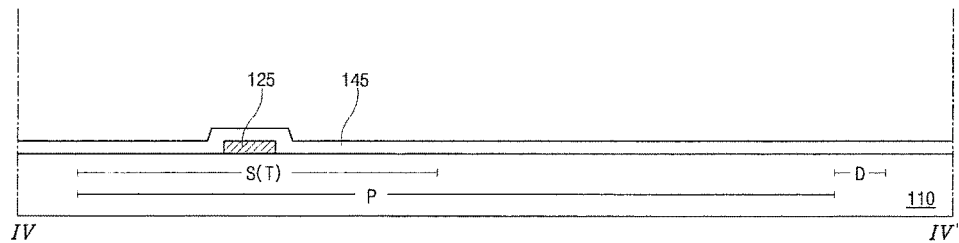
FIGS. 5A to 5I are cross-sectional views showing a fabricating process of a portion taken along the line IV-IV' in FIG. 3.

FIG. 5A shows a first mask process. In FIG. 5A, a first metal layer (not shown) is formed on the substrate 110 by depositing a conductive metallic material. The conductive metallic material includes copper (Cu), molybdenum (Mo), aluminum (Al), aluminum alloy (AlNd) and chrome (Cr). The first metal layer is patterned using a first mask (not shown) to form the gate line 120 (of FIG. 3) and the gate electrode 125. The gate electrode 125 extends from the gate line 120 (of FIG. 3) and is disposed in the switching region "S(T)". Next, a gate insulating layer 145 is formed on the substrate 110, where the gate line 120 (of FIG. 3) and the gate electrode 125 are formed, by depositing an inorganic insulating material. The inorganic insulating material includes silicon oxide ($SiO_2$) and silicon nitride ($SiN_x$).

Figure 5B:
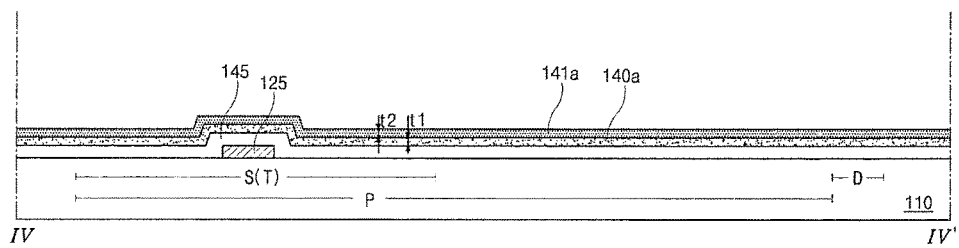
Figure 5C:
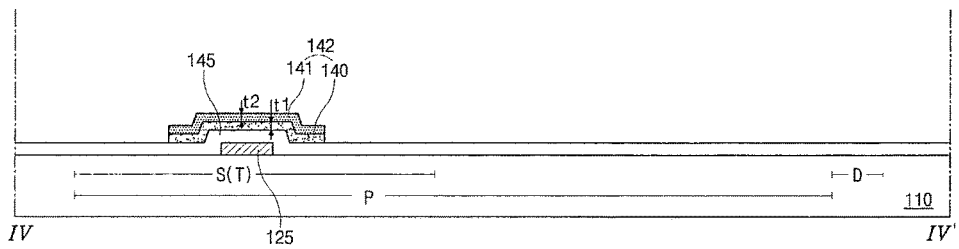

FIGS. 5B and 5C show a second mask process. In FIG. 5B, an intrinsic amorphous silicon layer 140a of intrinsic amorphous silicon and an impurity-doped amorphous silicon layer 141a of impurity-doped amorphous silicon are sequentially formed on the gate insulating layer 145. The intrinsic amorphous silicon layer 140a and the impurity-doped amorphous silicon layer 141a have first and second thickness "t1" and "t2", respectively. A ratio of the first thickness "t1" to the second thickness "t2" may be 1~1.5:1. For example, the first thickness "t1" of the intrinsic amorphous silicon layer 140a may be about 100 angstroms to about 700 angstroms, and the second thickness "t2" of the impurity-doped amorphous silicon layer 141a may be about 50 angstroms to about 500 angstroms. The active layer 140a may have substantially the same thickness as the ohmic contact layer 141a.

In FIG. 5C, the intrinsic amorphous silicon layer 140a (of FIG. 5B) and the intrinsic amorphous silicon layer 140a (of FIG. 5B) are patterned using a second mask (not shown) to form an active layer 140 and an ohmic contact layer 141. The active layer 140 overlaps the gate electrode 125, and the ohmic contact layer 141 is disposed on the active layer 140. Each of the active layer 140 and the ohmic contact layer 141 has an island shape. Since the active layer 140 and the ohmic contact layer 141 are patterned using a single mask, the active layer 140 and the ohmic contact layer 141 have the same plane area as each other. The active layer 140 and the ohmic contact layer 141 constitute a semiconductor layer 142. With compared to the active layer in the related art array substrate, the array substrate 140 in the array substrate according to the present invention has a relatively small thickness.

As mentioned above, the active layer 140 and the ohmic contact layer 141 constitute a semiconductor layer 142 to function as a semiconductor channel between the source electrode 132 and the drain electrode 134. To this end, the semiconductive layer 142 may be formed of suitable materials that may, for example, be doped with an appropriate amount of impurities to be a semiconductor having an appropriate level threshold voltage. Therefore, the semiconductive layer 142 does not short-circuit the source and drain electrodes 132 and 134 when there is no gate voltage, whereas the semiconductive layer 142 does connect the source and drain electrodes 132 and 134 when a gate voltage is applied to the gate electrode 125. In accordance with one embodiment, when the voltage to be applied between the source and drain electrodes 132 and 134 is, for example, 1 volt (V), the semiconductive layer 142 (i.e., the active layer 140 and/or the ohmic contact layer 141) can be doped with an appropriate amount of p-type or n-type impurities so that the semiconductive layer 142 can have a threshold voltage higher than 1 V, for example, 1.2 V. In accordance with one embodiment, the ohmic contact layer 141 may be doped to have a threshold voltage higher than 1V, while no or little dopant is added to the active layer 140. In another example, opposite types of impurities may be added to the active layer 140 and the ohmic contact layer 141.

Figure 5D:
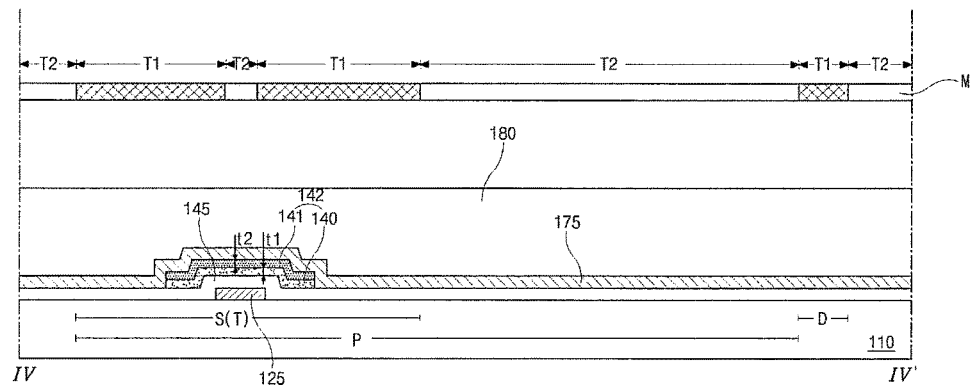
Figure 5E:
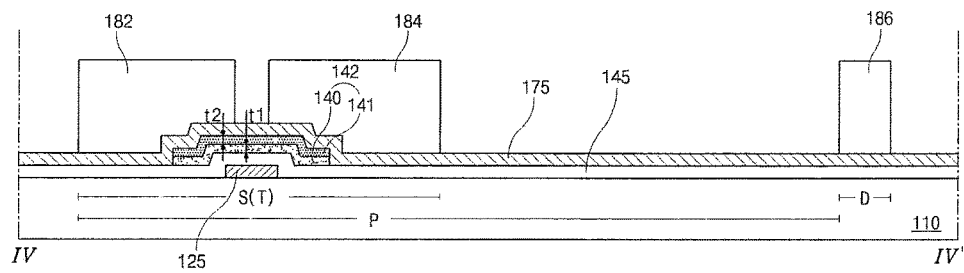
Figure 5F:
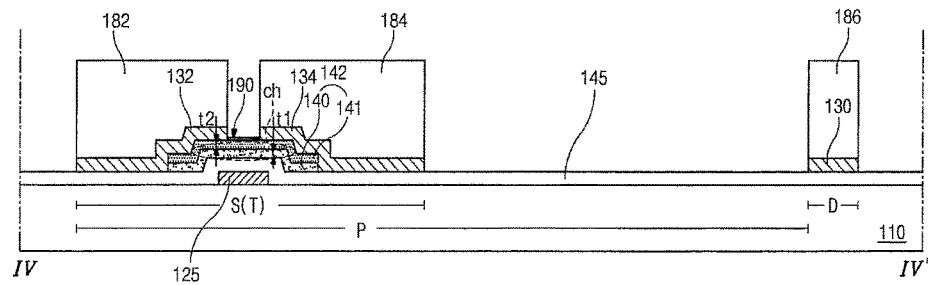

FIGS. 5D, 5E and 5F show a third mask process. In FIG. 5D, a second metal layer 175 is formed on the substrate 110 including the semiconductor layer 142 by depositing a conductive metallic material. The conductive metallic material includes copper (Cu), molybdenum (Mo), aluminum (Al), aluminum alloy (AlNd) and chrome (Cr). A photosensitive material layer 180 is formed on the second metal layer 175 by coating a photosensitive material such as photoresist (PR).

A third mask "M" including a blocking area "T1" and a transmitting area "T2" is disposed on the photosensitive material layer 180. The transmitting area "T2" has transmittance greater than that of the blocking area "T1". The blocking area "T1" shields light completely. The transmitting area "T2" has a relatively high transmittance, for example, about 100%, so that light through the transmitting area "T2" can completely change the photosensitive material layer 180 chemically. In the switching region "S(T)", the third mask "M" includes the transmitting area "T2" between the blocking area "T1". Namely, the transmitting area "T2" corresponds to a center of the gate electrode 125. The blocking area "T1" also corresponds to the data region "D". The transmitting area "T2" corresponds to other regions.

In FIG. 5E, the photosensitive material layer 180 (of FIG. 5D) is exposed through the mask "M" (of FIG. 5D) and then developed to form first, second and third photosensitive material patterns 182, 184 and 186. The first and second photosensitive material patterns 182 and 184 correspond to sides of the gate electrode 125 to expose a portion of the second metal layer 175. The exposed portion of the second metal layer 175 between the first and second photosensitive material patterns 182 and 184 corresponds to the center of the gate electrode 125. The third photosensitive material pattern 186 corresponds to the data region "D". By the exposing and developing processes on the photosensitive material layer 180 (of FIG. 5D), the photosensitive material layer 180 (of FIG. 5D) corresponding to the transmitting area "T2" (of FIG. 5D) of the third mask (of FIG. 5D) is removed to exposed the second metal layer 175.

In FIG. 5F, the exposed second metal layer 175 (of FIG. 5E) is patterned using the first, second and third the photosensitive material patterns 182, 184 and 186 as a patterning mask to form the data line 130, the source electrode 132 and the drain electrode 134. The data line 130 is positioned in the data region "D" and crosses the gate line 120 (of FIG. 3) to defined the pixel region "P". The source electrode 132 extends from the data line 130 and is spaced apart from the drain electrode 134. A portion of the ohmic contact layer 141 is exposed between the source and drain electrodes 132 and 134.

The second metal layer 175 (of FIG. 5E) is patterned by a wet-etching process or a dry-etching process. In the wet-etching process or the dry-etching process, a material of the ohmic contact layer 141 reacts with a material of the source and drain electrodes 132 and 134 such that a silicide layer 190 is formed on a surface of the ohmic contact layer 141 between the source and drain electrode 132 and 134. The active layer 140 and the ohmic contact layer 141 between the source and drain electrodes 132 and 134 function as a channel "ch". The silicide layer 190 on the ohmic contact layer 141 in the channel "ch" functions as a trap for an electron, which obstruct a flow of a free electron in the channel "ch", to increase a resistance. Accordingly, the silicide layer 190 is removed to improved properties of the TFT "T". The silicide layer 190 is removed by a dry-etching process using a reaction gas, for example, a hydrogen chloride (HCl) gas, a chlorine ($Cl_2$) gas, a sulfur hexafluoride gas ($SF_6$) or a carbon fluoride gas ($CF_4$), or a wet-etching process using an etchant, for example, a fluoric acid (HF) solution.

Figure 10A:
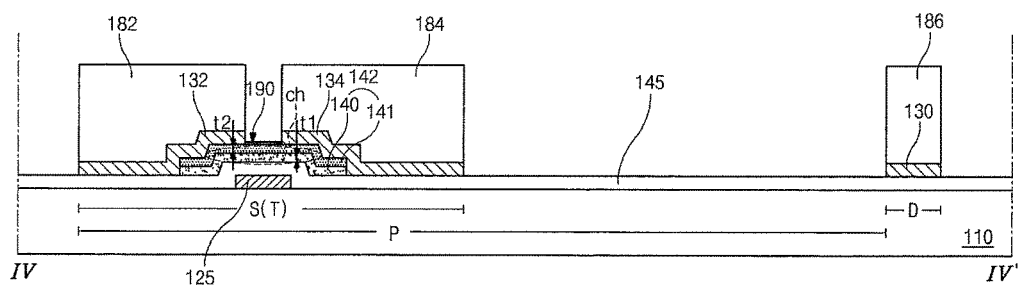
FIGS. 10A and 10B are cross-sectional views showing a fabricating process of a portion taken along the line IV-IV' in FIG. 3.
Figure 10B:
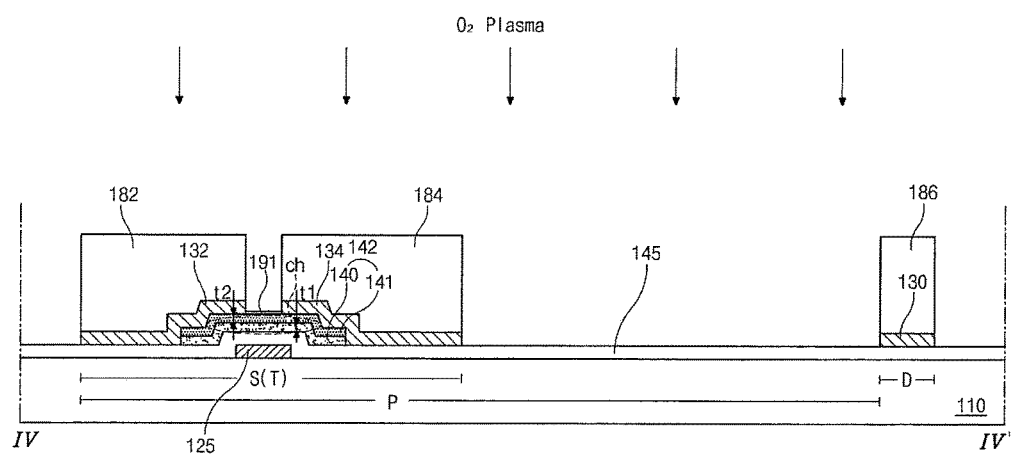

On the other hand, as shown in FIGS. 10A and 10B, a metal oxide layer 191 may be formed on the silicide layer 190 instead of removing the silicide layer 190 to improve mobility of a free electron in the channel "ch". The metal oxide layer 191 may be formed by an oxygen (O$_2$) plasma processing.

Figure 5G:
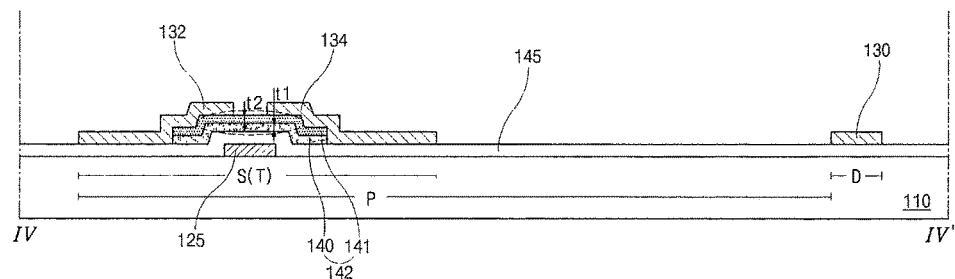

In FIG. 5G, the silicide layer 190 (of FIG. 5F) is removed such that a portion of the ohmic contact layer 141 is exposed between the source and drain electrodes 132 and 134. The first, second and third photosensitive material patterns 182, 184 and 186 are removed. The gate electrode 125, the gate insulating layer 145, the semiconductor layer 142, the source electrode 132 and the drain electrode 134 constitute the TFT in the switching region "S(T)".

Figure 5H:
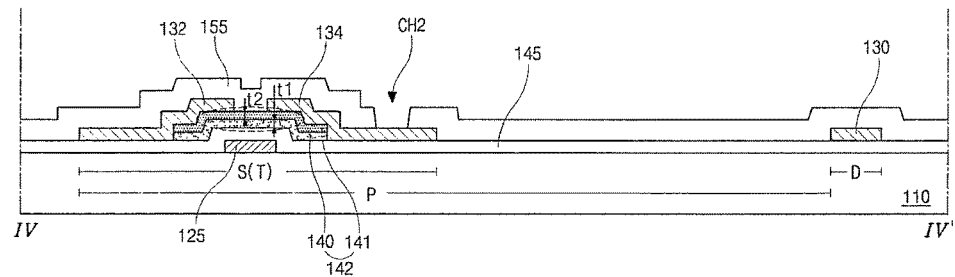

FIG. 5H shows a fourth mask process. In FIG. 5H, a passivation layer 155 is formed on the substrate 110 including the data line 130 and the TFT. The passivation layer 155 includes one of an inorganic insulating material, such as silicon nitride and silicon oxide, and an organic insulating material, such as acryl-based resin and benzocyclobutene (BCB). The passivation layer 155 is patterned using a fourth mask (not shown) to form a drain contact hole "CH2" exposing a portion of the drain electrode 134.

Figure 5I:
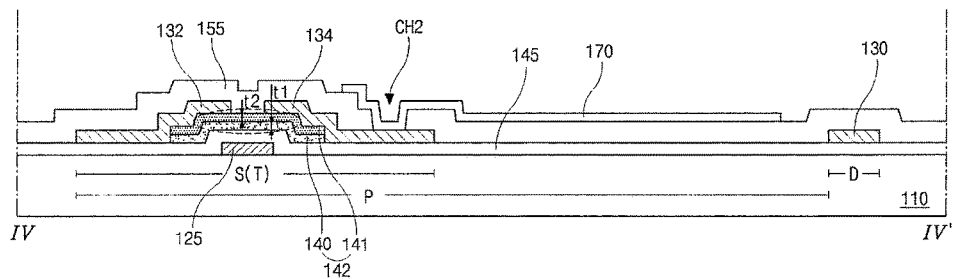

FIG. 5I shows a fifth mask process. In FIG. 5I, a transparent conductive metal layer (not shown) is formed on the passivation layer 155 including the drain contact hole "CH2". The transparent conductive metal layer includes a transparent conductive material, for example, indium-tin-oxide (ITO) or indium-zinc-oxide (IZO). The transparent conductive metal layer is patterned using a fifth mask (not shown) to form the pixel electrode 170 in the pixel region "P". The pixel electrode 170 contacts the drain electrode 134 through the drain contact hole "CH2".

Although not shown, the pixel electrode 170 extends to a previous gate line 120 (of FIG. 3) to overlap a portion of the gate line 120. The overlapped portion of the gate line 120 functions as a first electrode, the overlapped portion of the pixel electrode 120 functions as a second electrode, and the gate insulating layer 145 and the passivation layer 155 function as a dielectric material layer. The first electrode, the second electrode and the dielectric material layer constitute a storage capacitor "Cst" (of FIG. 3). On the other hand, although not shown, a metal pattern (not shown), which is disposed on the gate insulating layer 145, may be disposed between the first and second electrodes. The metal pattern is connected to one of the first and second electrodes. In this case, only one of the gate insulating layer and the passivation layer functions as the dielectric material layer.

When a negative voltage is applied into the gate electrode 125, there is no free electron in the channel "ch" including the active layer 140 and the ohmic contact layer 141 such that the TFT "T" is driven in an Off state. On the other hand, when a positive voltage is applied into the gate electrode 125, a free electron is accumulated on the channel "ch" such that the TFT "T" is driven in an On state. In the On state of the TFT "T", a data signal in the data line 130 is supplied into the pixel electrode 170 through the TFT "T". As a result, the liquid crystal layer (not shown) is driven by an electric field induced between the pixel electrode 170 and a common electrode (not shown) on a color filter substrate facing the array substrate such that the LCD device display images.

In the array substrate according to the present invention, since the active layer 140 has a relatively small thickness with compared to the active layer of the related art array substrate, a distance between the gate electrode 125 and the ohmic contact layer 141 is reduced. Accordingly, even if the exposed portion of the ohmic contact layer 141 between the source and drain electrodes 132 and 134 is not removed, the active layer 140 and the ohmic contact layer 141 function as a channel "ch".

In more detail, in the related art array substrate, since the active layer is thicker than the ohmic contact layer, a distance between the gate electrode and the ohmic contact layer is relatively far. Accordingly, if the exposed portion of the ohmic contact layer between the source and drain electrodes and is not removed, it is impossible to control the On or Off state of the TFT by applying a negative or positive voltage into the gate electrode. However, since the distance between the gate electrode 125 and the ohmic contact layer 141 is close due to the reduced thickness of the active layer 140, the TFT "T" has an On or Off state by applying a negative or positive voltage into the gate electrode 125. Namely, not only the active layer 140 but also the ohmic contact layer 141 functions as a channel "ch".

Moreover, a photo leakage current is relieved due to the active layer 140 having the reduced thickness. Accordingly, the TFT "T" has improved properties and the LCD can display high quality images. Furthermore, since a process for removing a portion of the ohmic contact layer can be omitted, the fabricating process is simplified and the production time is reduced. Accordingly, productivity is improved.

Figure 6:
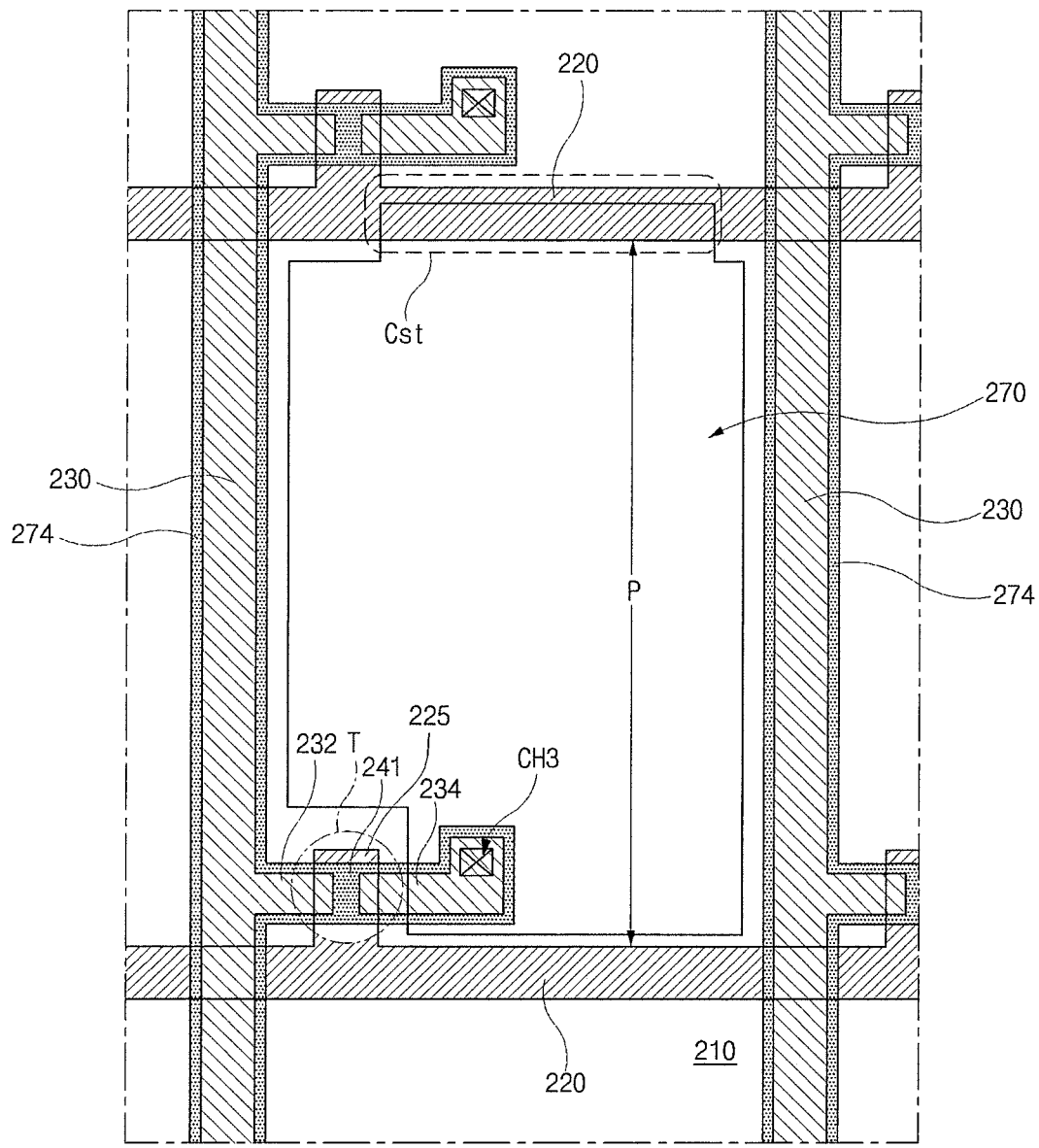
FIG. 6 is a plan view of a pixel region of an array substrate for an LCD device according to a second embodiment of the present invention.

FIG. 6 is a plan view of a pixel region of an array substrate for an LCD device according to a second embodiment of the present invention. In the second embodiment, a number of mask processes can be reduced.

In FIG. 6, a gate line 220 is formed on a substrate 210, and a data line 230 crosses the gate line 220 to define a pixel region "P". The data line 230 may be perpendicular or inclined to the gate line 220. A thin film transistor (TFT) "T" as a switching element is formed at a crossing portion of the gate and data lines 220 and 230. The TFT "T" includes a gate electrode 225, a gate insulating layer (not shown), a semiconductor layer (not shown) including an active layer (not shown) and an ohmic contact layer (not shown), a source electrode 232 and a drain electrode 234. The gate electrode 225 extends from the gate line 220, and the gate insulating layer (not shown) is formed on the gate line 220 and the gate electrode 225. The semiconductor layer (not shown) is formed on the gate insulating layer (not shown) and overlaps the gate electrode 225. The ohmic contact layer (not shown) is disposed on the active layer (not shown) and has the same plane area as the active layer (not shown). The source electrode 232 extends from the data line 230 and is spaced apart from the drain electrode 234. The source and drain electrodes 232 and 234 contact the ohmic contact layer (not shown). In accordance with one embodiment, the active layer and the ohmic contact layer may constitute a semiconductor layer to function as a semiconductor channel between the source electrode 232 and the drain electrode 234. To this end, the semiconductive layer may be formed of suitable materials that may, for example, be doped with an appropriate amount of impurities to be a semiconductor having an appropriate level threshold voltage. Therefore, the semiconductive layer does not short-circuit the source and drain electrodes 232 and 234 when there is no gate voltage, whereas the semiconductive layer does connect the source and drain electrodes 232 and 234 when a gate voltage is applied to the gate electrode 225. By way of example, when the voltage to be applied between the source and drain electrodes 232 and 234 is, for instance, 1 V, the semiconductive layer may be doped with an appropriate amount of p-type or n-type impurities so that the semiconductive layer can have a threshold voltage higher than 1 V, for example, 1.2-1.5 V.

The active layer (not shown) of intrinsic amorphous silicon has a first thickness, and the ohmic contact layer (not shown) of impurity-doped amorphous silicon has a second thickness. For example, the first thickness of the active layer (not shown) may be about 100 angstroms to about 700 angstroms, and the second thickness of the ohmic contact layer (not shown) may be about 50 angstroms to about 500 angstroms. The active layer (not shown) may have substantially the same thickness as the ohmic contact layer (not shown). A portion of the ohmic contact layer (not shown) is exposed between the source and drain electrodes 132 and 134. A semiconductor pattern 274 extends from the semiconductor layer (not shown) in the TFT "T" into the data line 130. As a result, the semiconductor pattern 274 is disposed under the data line 130.

In addition, a passivation layer (not shown) including a drain contact hole "CH3" is formed on the TFT "T". The drain contact hole "CH3" exposes a portion of the drain electrode 234. A pixel electrode 270, which is formed on the passivation layer (not shown) and in the pixel region "P", contacts the drain electrode 234 through the drain contact hole "CH3". The pixel electrode 270 extends to a previous gate line 220 to overlap a portion of the gate line 220. The overlapped portion of the gate line 220 functions as a first electrode, the overlapped portion of the pixel electrode 270 functions as a second electrode, and the gate insulating layer (not shown) and the passivation layer (not shown) function as a dielectric material layer. The first electrode, the second electrode and the dielectric material layer constitute a storage capacitor "Cst". On the other hand, although not shown, a metal pattern (not shown), which is disposed on the gate insulating layer (not shown), may be disposed between the first and second electrodes. The metal pattern is connected to one of the first and second electrodes. In this case, only one of the gate insulating layer and the passivation layer functions as the dielectric material layer.

The array substrate according to the second embodiment of the present invention is fabricated by a four mask process. In a first mask process, the gate line 220 and the gate electrode 225 are formed on the substrate 210. In addition, the gate insulating layer is formed on the gate line 220 and the gate electrode 225. In a second mask process, the active layer, the ohmic contact layer, the source electrode 232, the drain electrode 234 and the data line 230 are formed. In more detail, an intrinsic amorphous silicon layer, an impurity-doped amorphous silicon layer and a metal layer are sequentially formed on the gate insulating layer. Then, the metal layer, the impurity-doped amorphous silicon layer and the intrinsic amorphous silicon layer are patterned using a half-tone mask including a transmitting area, a blocking area and a half-transmitting area. A transmittance of the half-transmitting area is smaller than that of the transmitting area and greater than that of the blocking area. Due to the half-tone mask, there are first and second photosensitive material patterns having a difference in a height. As a result, the active layer, the ohmic contact layer, the source electrode 232, the drain electrode 234 and the data line 230 are formed by a single mask process. In a third mask process, the passivation layer including the drain contact hole "CH3" is formed on the data line 130 and the TFT "T". In a fourth mask process, the pixel electrode 170 is formed on the passivation layer.

In the array substrate according to the present invention, since the active layer has a relatively small thickness with compared to the active layer of the related art array substrate, a distance between the gate electrode and the ohmic contact layer is reduced. Accordingly, even if the exposed portion of the ohmic contact layer between the source and drain electrodes and is not removed, the active layer and the ohmic contact layer function as a channel. The TFT has an On or Off state by applying a negative or positive voltage into the gate electrode.

Moreover, a photo leakage current is relieved due to the active layer having the reduced thickness. A wavy noisy problem, which results from the semiconductor pattern under the data line, is relieved due to the active layer having the reduced thickness. Accordingly, the TFT has improved properties and the LCD can display high quality images. Furthermore, since a process for removing a portion of the ohmic contact layer can be omitted, the fabricating process is simplified and the production time is reduced. Accordingly, productivity is improved.

FIG. 7 is a graph showing an I-V transfer curve in a TFT of an array substrate according to an embodiment of the present invention. In FIG. 7, the reference number (1) shows an I-V transfer curve in the TFT of the related art array substrate, and the reference numbers (2) to (5) show an I-V transfer curve in the TFT of the array substrate according to the present invention. The active layer and the ohmic contact layer have a thickness of about 300 angstroms and about 100 angstroms, respectively, in the curve (2), and the active layer and the ohmic contact layer have a thickness of about 300 angstroms and about 200 angstroms, respectively, in the curve (3). The active layer and the ohmic contact layer have a thickness of about 500 angstroms and about 100 angstroms, respectively, in the curve (4), and the active layer and the ohmic contact layer have a thickness of about 500 angstroms and about 200 angstroms, respectively, in the curve (5). When a drain-source voltage (Vds) of about 1 V is applied and the gate-source voltage (Vgs) is varied within a range of −10V to 20V, a drain-source current (Ids) is measured. The drain-source current (Ids) in the curves (2) to (5) is increased with compared to the curve (1). Namely, FIG. 7 shows the TFT in the array substrate according to the present invention has an improved property.

FIG. 8 is a graph showing mobility of an electric charge depending on a gate voltage in a TFT of an array substrate according to an embodiment of the present invention. In FIG. 8, the reference number (1) shows mobility of an electric charge in the TFT of the related art array substrate, and the reference number (2) shows mobility of an electric charge in the TFT of the array substrate according to the present invention. When a source-drain voltage (Vds) of about 1 V is applied and the gate-source voltage (Vgs) is varied within a range of −5V to 20V, the mobility of the electric charge in the TFT is measured. When the TFT turns on by applying the gate-source voltage (Vgs) of about 10V to 15V, the mobility of the electric charge in the related art TFT is about 0.4 $cm^2/Vs$ (curve (1)), while the mobility of the electric charge in the TFT according to the present invention is over 1.1 $cm^2/Vs$ (curve (2)). Accordingly, the mobility of the electric charge in the TFT according to the present invention is improved.

FIG. 9 is a graph showing a drain-source current depending on a gate-source voltage in a TFT of an array substrate according to an embodiment of the present invention. In FIG. 9, the curve (1) and (2) show a drain-source current (Ids) in a TFT of the related art array substrate measured in a light irradiating condition and a light non-irradiating condition, respectively. The intensity of the light is about 400 lux. The curve (3) and (4) show a drain-source current (Ids) in a TFT of the array substrate according to the present invention measured in a light irradiating condition and a light non-irradiating condition, respectively. In the TFT of the array substrate according to the present invention, the active layer has a thickness of about 300 angstroms and the ohmic contact layer has a thickness of about 100 angstroms. When a drain-source voltage (Vds) of about 1 V is applied and the gate-source voltage (Vgs) is varied within a range of −20V to 20V, the drain-source current (Ids) in the curve (3) and (4) is smaller than that in the curve (1) and (2). Namely, a photo leakage current problem in the TFT of the array substrate according to the present invention is relieved.

It will be apparent to those skilled in the art that various modifications and variations can be made in the array substrate for the LCD device and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a liquid crystal display device, comprising:
   forming a gate line and a gate electrode on a substrate, the gate electrode connected to the gate line;
   forming a gate insulating layer on the gate line and the gate electrode;
   forming an active layer of intrinsic amorphous silicon on the gate insulating layer and an ohmic contact layer of impurity-doped amorphous silicon on the active layer, the active layer corresponding to the gate electrode;
   forming a data line, a source electrode and a drain electrode, the data line crossing the gate line, the source electrode on the ohmic contact layer and connected to the data line, and the drain electrode on the ohmic contact layer and spaced apart from the source electrode;
   forming a passivation layer on the source electrode and the drain electrode and including a drain contact hole exposing a portion of the drain electrode; and
   forming a pixel electrode on the passivation layer and connected to the drain electrode through the drain contact hole,
   wherein the ohmic contact layer covers an entire top surface of the active layer in a space between the source electrode and the drain electrode, and
   wherein the step of forming the data line, the source electrode and the drain electrode includes:
   forming a metallic material layer on the gate insulating layer and the ohmic contact layer;
   etching the metallic material layer using a mask to form the data line, the source electrode, and the drain electrode, wherein a silicide layer is formed on the ohmic contact layer only in the space between the source electrode and the drain electrode; and
   removing the silicide layer.

2. The method according to claim 1, wherein the active layer has substantially the same thickness as the ohmic contact layer.

3. The method according to claim 1, wherein the active layer has a thickness of about 100 angstroms to about 700 angstroms, and the ohmic contact layer has a thickness of about 50 angstroms to about 500 angstroms.

4. The method according to claim 1, wherein the step of forming the active layer and the ohmic contact layer and the step of forming the data line, the source electrode and the drain electrode are performed by a single mask process.

5. The method according to claim 4, wherein the single mask process includes:
   sequentially forming an intrinsic amorphous silicon layer, an impurity-doped amorphous silicon layer and a metal layer on the gate insulating layer;
   forming a photosensitive material layer on the metal layer;
   disposing a mask including a transmitting area, a half-transmitting area and a blocking area;
   forming first and second photosensitive material patterns having a difference in a thickness; and
   etching the metal layer, the impurity-doped amorphous silicon layer and the intrinsic amorphous silicon layer using the first and second photosensitive material patterns.

6. The method according to claim 1, wherein the step of removing the silicide layer includes a dry-etching process using one of a hydrogen chloride (HCl) gas, a chlorine (Cl2) gas, a sulfur hexafluoride gas (SF6) and a carbon fluoride gas (CF4) or a wet-etching process using a fluoric acid (HF) solution.

7. The method according to claim 1, further comprising forming a metal oxide layer by an oxygen plasma processing on the silicide layer.

8. The method according to claim 1, wherein the pixel electrode overlaps a previous gate line to form a storage capacitor.

9. The method according to claim 8, wherein the step of forming the data line, the source electrode and the drain electrode further includes forming a metal pattern overlapping the previous gate line and the pixel electrode and disposed on the gate insulating layer, and wherein the metal pattern is connected to one of the previous gate line and the pixel electrode.

10. A method of fabricating an array substrate for a liquid crystal display device, comprising:
    forming a gate line and a gate electrode on a substrate, the gate electrode connected to the gate line;
    forming a gate insulating layer on the gate line and the gate electrode;
    forming an active layer of intrinsic amorphous silicon on the gate insulating layer and an ohmic contact layer of impurity-doped amorphous silicon on the active layer, the active layer corresponding to the gate electrode;
    forming a data line, a source electrode and a drain electrode, the data line crossing the gate line, the source electrode on the ohmic contact layer and connected to the data line, and the drain electrode on the ohmic contact layer and spaced apart from the source electrode;
    forming a passivation layer on the source electrode and the drain electrode and including a drain contact hole exposing a portion of the drain electrode; and
    forming a pixel electrode on the passivation layer and connected to the drain electrode through the drain contact hole,
    wherein the ohmic contact layer covers an entire top surface of the active layer in a space between the source electrode and the drain electrode, and
    wherein the step of forming the data line, the source electrode and the drain electrode includes:
    forming a metallic material layer on the gate insulating layer and the ohmic contact layer;
    etching the metallic material layer using a mask to form the data line, the source electrode, and the drain electrode, wherein a silicide layer is formed on the ohmic contact layer only in the space between the source electrode and the drain electrode; and
    performing an oxygen plasma process on the silicide layer such that a metal oxide layer is formed, wherein the metal oxide layer contacts an upper surface of the ohmic contact layer in a region over a center of the gate electrode.

11. The method according to claim 10, wherein the active layer has substantially the same thickness as the ohmic contact layer.

12. The method according to claim 10, wherein the active layer has a thickness of about 100 angstroms to about 700 angstroms, and the ohmic contact layer has a thickness of about 50 angstroms to about 500 angstroms.

13. The method according to claim 10, wherein the step of forming the active layer and the ohmic contact layer and the step of forming the data line, the source electrode and the drain electrode are performed by a single mask process.

14. The method according to claim 13, wherein the single mask process includes:

sequentially forming an intrinsic amorphous silicon layer, an impurity-doped amorphous silicon layer and a metal layer on the gate insulating layer;

forming a photosensitive material layer on the metal layer;

disposing a mask including a transmitting area, a half-transmitting area and a blocking area;

forming first and second photosensitive material patterns having a difference in a thickness; and etching the metal layer, the impurity-doped amorphous silicon layer and the intrinsic amorphous silicon layer using the first and second photosensitive material patterns.

15. The method according to claim 10, wherein the pixel electrode overlaps a previous gate line to form a storage capacitor.

16. The method according to claim 15, wherein the step of forming the data line, the source electrode and the drain electrode further includes forming a metal pattern overlapping the previous gate line and the pixel electrode and disposed on the gate insulating layer, and wherein the metal pattern is connected to one of the previous gate line and the pixel electrode.

* * * * *